(12) United States Patent
Böttcher et al.

(10) Patent No.: US 11,978,780 B2
(45) Date of Patent: May 7, 2024

(54) SEMICONDUCTOR DEVICE AND ELECTRICAL CONTACT

(71) Applicant: NEXPERIA B.V., Nijmegen (NL)

(72) Inventors: Tim Böttcher, Nijmegen (NL); Olrik Schumacher, Nijmegen (NL); Jan Fischer, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 22 days.

(21) Appl. No.: 16/715,317

(22) Filed: Dec. 16, 2019

(65) Prior Publication Data

US 2020/0194568 A1 Jun. 18, 2020

(30) Foreign Application Priority Data

Dec. 17, 2018 (EP) .................................... 18212940

(51) Int. Cl.
*H01L 29/47* (2006.01)
*H01L 29/161* (2006.01)
*H01L 29/45* (2006.01)
*H01L 29/66* (2006.01)
*H01L 29/872* (2006.01)

(52) U.S. Cl.
CPC ............ *H01L 29/47* (2013.01); *H01L 29/161* (2013.01); *H01L 29/45* (2013.01); *H01L 29/66143* (2013.01); *H01L 29/872* (2013.01)

(58) Field of Classification Search
CPC ....................................................... H01L 29/45
See application file for complete search history.

(56) References Cited

U.S. PATENT DOCUMENTS

| | | | |
|---|---|---|---|
| 9,461,183 B2 | 10/2016 | Boettcher et al. | |
| 2002/0087098 A1* | 7/2002 | Iwami | B41M 5/267 600/585 |
| 2003/0183895 A1* | 10/2003 | Okamura | H01L 29/872 257/454 |
| 2005/0069266 A1* | 3/2005 | Kouta | H01S 5/02365 385/92 |
| 2008/0128903 A1* | 6/2008 | Okayama | H01L 24/11 257/737 |

(Continued)

FOREIGN PATENT DOCUMENTS

| | | |
|---|---|---|
| EP | 3051593 A1 | 8/2016 |
| JP | H09246209 A | 9/1997 |

OTHER PUBLICATIONS

Extended European Search Report and Written Opinion for corresponding application EP18212940.3 9 pages, dated May 28, 2019.

(Continued)

*Primary Examiner* — Mohammad A Rahman
(74) *Attorney, Agent, or Firm* — Ruggiero, McAllister & McMahon LLC

(57) ABSTRACT

The disclosure relates to an electrical contact structure, and corresponding method of manufacturing an electrical contact structure, for a discrete semiconductor device. The electrical contact includes a first metal layer configured and arranged to contact a strained active area of a semiconductor die, a second metal layer configured and arranged to contact the first metal layer, and a third metal layer configured and arranged to contact the second metal layer.

15 Claims, 4 Drawing Sheets

(56) References Cited

U.S. PATENT DOCUMENTS

| | | | |
|---|---|---|---|
| 2011/0095361 A1* | 4/2011 | Chang | H01L 29/47 |
| | | | 257/334 |
| 2015/0194409 A1* | 7/2015 | Chuang | H01L 24/11 |
| | | | 257/737 |
| 2016/0181216 A1* | 6/2016 | Lei | H01L 24/13 |
| | | | 438/26 |
| 2016/0225918 A1* | 8/2016 | Boettcher | H01L 29/66136 |
| 2018/0165396 A1* | 6/2018 | Lin | H10B 41/35 |
| 2019/0086446 A1* | 3/2019 | Elsäßer | G01R 15/165 |
| 2019/0198983 A1* | 6/2019 | Moore | G02B 27/0176 |

OTHER PUBLICATIONS

Kim et al "Effects of Cu/Al Intermetallic Compound (IMC) on Copper Wire and Aluminum Pad Bondability", IEEE, Electronic Materials and Packaging (Nov. 19, 2001) pp. 44-51, ISBN: 978-0-7803-7157-6.

Hurkx et al. "Low-Voltage SiGe Power Diodes", IEEE, Proceedings of the 13th Internaional Symposium on Power Semiconductor Devices & ICS (Jun. 4, 2001) pp. 239-242 ISBN: 978-4-88686-056-9.

Brown et al. "SiGe Fast-Switching Power Diodes", IEEE, (Dec. 6, 1998) pp. 699-702, ISBN: 978-0-7803-4774-8.

* cited by examiner

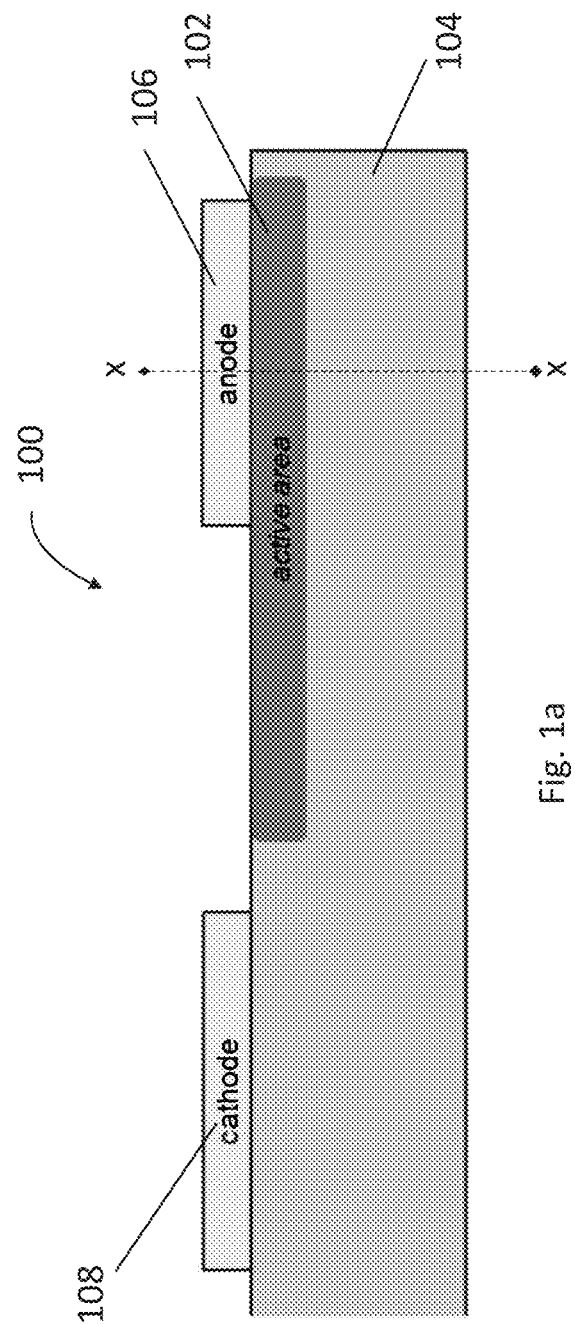

SEMICONDUCTOR DEVICE AND ELECTRICAL CONTACT

CROSS REFERENCE TO RELATED APPLICATIONS

This application claims the benefit under 35 U.S.C. § 119(a) of European Application No. 18212940.3 filed Dec. 17, 2018 the contents of which are incorporated by reference herein in their entirety.

BACKGROUND OF THE DISCLOSURE

1. Field of the Disclosure

The present disclosure relates to an electrical contact for a semiconductor device and in particular a semiconductor diode comprising silicon germanium. The present disclosure also relates to a semiconductor diode comprising such an electrical contact and a method of manufacturing the electrical contact.

2. Description of the Related Art

Semiconductor devices comprising a silicon germanium (SiGe) provide a promising alternative to standard silicon devices in high-frequency switching applications because of the low bandgap of SiGe and its compatibility with standard silicon processing techniques. SiGe diodes can exhibit very steep forward current-voltage characteristics which can result in relatively low forward voltage drop at high current densities (typically above 1 A/mm2 of active device area). Such semiconductor diodes are typically formed of a layer of SiGe formed on underlying silicon layers, such an epitaxial silicon layer formed on a silicon substrate. However, due to mechanical strain induced by the lattice mismatch between the SiGe layer and the underlying silicon, the SiGe layer is susceptible to mechanical defects and damage.

Packaging such a discrete semiconductor device, which typically have an area of 1 mm2, comprising silicon germanium into a standard package formats, such as for instance SOT-23 or LFPAK, will cause further mechanical stress on the device due to thermomechanical stresses during the packaging and contacting processes, and during and the operational lifetime of the device. Such stresses can arise when contacting the device to external contacts of the device and such stresses can potentially render the device inoperable following packaging or during the lifetime of operation. Small area SiGe heterojunction bipolar transistors (typically 10 μm2) are used in integrated circuit packages, but because the device area of such transistors is small stress caused by packaging is less important when they form part of an integrated circuit. Furthermore, in integrated circuit technology SiGe layers do not directly contact a metal contact layer, but instead use a polysilicon layer between the SiGe layer and the metal. As a result of the above mentioned problems there are currently no discrete SiGe diodes available on the market.

SUMMARY

Various example embodiments are directed to issues such as those addressed above and/or others which may become apparent from the following disclosure concerning an electrical contact structure for a relatively large scale (typically 1 mm$^2$) discrete SiGe semiconductor device which does not induce mechanical stress in the underlying SiGe active layers.

According to a first embodiment there is provided an electrical contact structure for a discrete semiconductor device, the electrical contact comprising: a first metal layer configured and arranged to contact a strained active area of a semiconductor die; a second metal layer configured and arranged to contact the first metal layer; and a third metal layer configured and arranged to contact the second metal layer.

The strained active area of the semiconductor die may be an anode region, and the anode may be formed of a silicon germanium (SiGe) material. The first metal layer may be configured to be arranged directly on the strained active area to form a Schottky barrier, and the first metal layer may be formed of one of NiSi$_2$, CoSi$_2$, TiN, WTiN or WTi.

The second metal layer is an interface layer arranged on the first metal layer and is formed of a plastically deformable metal. The second metal layer may be formed of Al or Ag, or formed of an alloy of Al comprising Si and/or Cu.

The third metal layer may be an Ohmic contact layer and may be arranged to contactably receive a clip bond, wire bond or bump bond.

When the third metal layer is arranged for clip bonding, the third metal layer may be formed of one of:
Ni, Cu; or Ag;
a stack of Ni and Ag;
a stack of Ti and Ni;
a stack of Cu and Sn;
a stack of Ti and NiV;
a stack of Ti Ni and Ag; or
a stack of Ti, NiV and Ag.

When the third metal layer is arranged for wire bonding, the third metal layer may be formed of one of: Al; AlSi; AlCu; AlSiCu; Cu; or Ag.

When the third metal layer is arranged for bump bonding the third metal layer may be formed of one of Ni; Ag; a stack of Ni and Ag; a stack of Ni and Pd and Au; or a stack of Cu and Sn. Optionally, the third metal layer includes an initial layer of Ti.

According to a second embodiment there is also provided a discrete semiconductor device comprising the electrical contact according to the first embodiment.

According to an embodiment there is also provided a method of manufacturing an electrical contact for a discrete semiconductor device, the method comprising: forming a first metal layer configured and arranged to contact a strained active area of a semiconductor die; forming a second metal layer to contact the first metal layer; and a forming a third metal layer to contact the second metal layer.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 1a illustrates a schematic of a semiconductor device structure according to an embodiment;

DETAILED DESCRIPTION

Figure 1B:
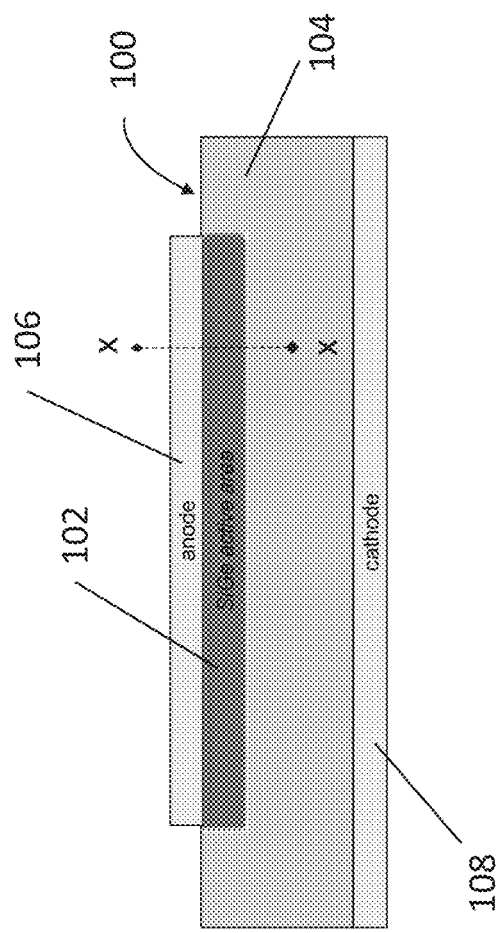
FIG. 1b illustrates a schematic of a semiconductor device structure according to an embodiment.

With reference to FIG. 1a, a schematic of a lateral semiconductor device structure 100 according to embodiments is illustrated. Such a semiconductor device structure 100 may be implemented in a semiconductor package, and for brevity the package outline, leadframe and external terminals have been omitted. However, the skilled person will appreciate that the package outline may be any standard discrete package outline such as SOT-23 or LFPAK.

The semiconductor device structure 100 comprises an active area 102 formed on a first major surface of an epitaxial layer 104, forming a semiconductor die. Whilst not illustrated, the skilled person will appreciate that the epitaxial layer 104 may be formed on a substrate. Alternatively, the active area 102 may be formed directly on the substrate without an epitaxial layer 104. The epitaxial layer 104 may be a silicon layer and the substrate may be a silicon substrate. The active area 102 may be formed on the epitaxial layer 104, or the silicon substrate, by epitaxial methods. There may be a lattice mismatch between the active area 102 and the underlying epitaxial layer 104, or substrate, such that the active area may be formed as a stained layer. The active area 102 may be a SiGe layer.

A first electrical contact 106 may be formed on the active area 102 and a second electrical contact 108 may be formed on the first major surface of the epitaxial layer 104 separated from the active area 102. The first electrical contact 106 may be an anode contact and the second electrical contact 108 may be a cathode contact. In this regard the device structure 100 of FIG. 1a is a lateral device structure.

FIG. 1b illustrates a further embodiment, where like reference numerals correspond to like features of FIG. 1b. As with FIG. 1a, the arrangement of FIG. 1b a schematic of a semiconductor device structure 100 according to embodiments, which may be implemented in a semiconductor package as explained above. The semiconductor device structure 100 comprises an active area 102 formed on a first major surface of an epitaxial layer 104, forming a semiconductor die. Whilst not illustrated, the skilled person will appreciate that the epitaxial layer 104 may be formed on a substrate. Alternatively, the active area 102 may be formed directly on the substrate without an epitaxial layer 104. The epitaxial layer 104 may be a silicon layer and the substrate may be a silicon substrate. The active area 102 may be formed on the epitaxial layer 104, or the silicon substrate, by epitaxial methods. There may be a lattice mismatch between the active area 102 and the underlying epitaxial layer 104, or substrate, such that the active area may be formed as a stained layer. The active area 102 may be a SiGe layer.

A first electrical contact 106 may be formed on the active area 102 and a second electrical contact 108 may be formed on a second major surface of the epitaxial layer 104, or where there is no epitaxial layer 104 on a second major surface of the substrate. The second major surface is opposite the first major surface and in this regard the second electrical contact is said to be on the back side of the semiconductor device structure 100. The first electrical contact 106 may be an anode electrical contact and the second electrical contact 108 may be a cathode electrical contact. In this regard, the diode structure 100 of FIG. 1b is said to be a vertical device structure.

Figure 2:
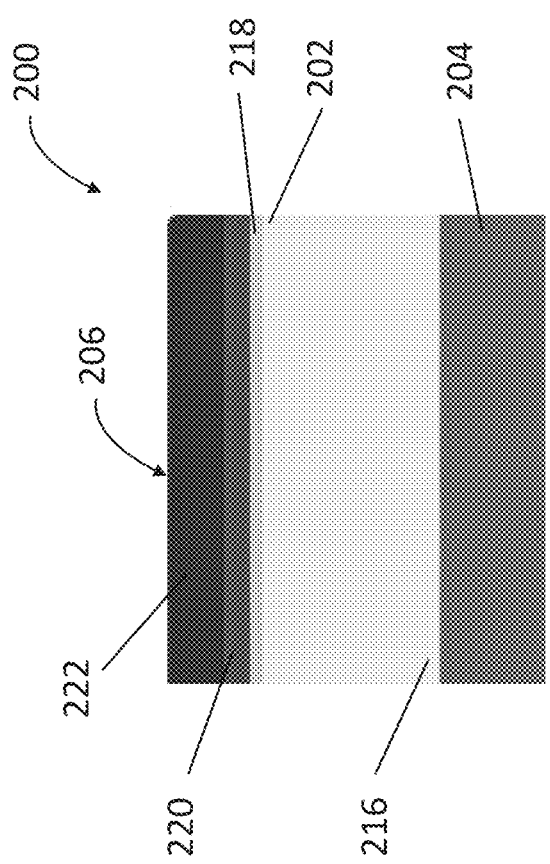
FIG. 2 illustrates a schematic view of an electrical contact structure and active area structure according to an embodiment.

FIG. 2 is the cross-section taken through line X-X of FIG. 1a or FIG. 1b and illustrates the semiconductor device structure 200 and anode electrical contact 206 structure of FIG. 1a and FIG. 1b in more detail. The semiconductor device structure 200 and the anode electrical contact structure 206 may comprise the following arrangement of layers. The diode structure 200 may comprise a semiconductor substrate 204 and may have an epitaxial layer 216 formed thereon. An active area 202 may be formed on the epitaxial layer 216. However, as discussed above, the epitaxial layer 216 may be omitted and the active area 202 may be formed directly on the semiconductor substrate 204. The semiconductor substrate 204 may be a silicon substrate, the epitaxial layer may be a silicon layer and the active area 202 may be a SiGe layer.

The electrical contact 206 may be arranged on a portion of the active area 202 of the semiconductor device structure 200. The anode electrical contact structure 206 may comprise a first metal layer 218 arranged in contact with all of or a portion of the active area 202. A second metal layer 220 is then arranged on the first metal layer 218, and a third metal layer 222 is arranged on the second metal layer 220.

The first metal layer 218 may be a barrier metal, the second metal layer 220 may be an intermediate metal layer, and the third metal layer 222 may be a contact metal layer for connection, via for example wire bonding, clip bonding, or bump bonding to external terminals when the arrangement is packaged. The first metal layer 218 is a base layer in that it contacts the active area 202. Second metal layer 220 is the intermediate layer, that is intermediate the first metal layer 218 and the third metal layer 222. Third metal layer 222 is the top layer and is arranged for making external electrical contact to the active area 202, via the first metal layer 218 and the second metal layer, using for example a wire bond connection, a clip bond connection or a bump bond connection.

The first metal layer 218, also known as the base metal layer, is formed to contact the active area 202 and is arranged to provide a Schottky barrier in combination with the active area 202. The first metal layer also serves to form a diffusion barrier between the active area 202 and the subsequent second and third metal layers 220, 222. In terms of the Schottky barrier arrangement, the first metal layer 218 should have a barrier energy or work function in that matches the active area 202. Where the active area 202 is SiGe the barrier energy or work function may be in the region of 0.5-0.6 eV based on silicon reference material. Examples of materials for forming the first metal layer 218 may be selected from one of $NiSi_2$, $CoSi_2$, TiN, WTiN or WTi. The first metal layer 218 is in direct contact with the active area 202. In addition to providing a Schottky barrier and forming a diffusion barrier, the first metal layer 218 also provides good adhesion to the active area 202 and allows good adhesion of the subsequent, intermediate, second metal layer 220 thereto. In addition, the first metal layer 218 is resistant to mechanical packaging stresses that can arise when wire bonds, clip bond or bump bonds are formed on the electrical contact 206 structure.

As mentioned, such mechanical packaging stresses may cause damage to the active area 202 due to the strained nature induced by the lattice mismatch with the epitaxial layer or substrate.

In addition, the selection of one of $NiSi_2$, $CoSi_2$, TiN, WTiN or WTi is such that the first metal layer 218 will form no silicides or only thin silicides at the interface of the metal and silicon based semiconductor at processing temperatures below 400° C. A silicide is a metal silicon compounds formed as a result of metals in contact with the underlying silicon based layer. The formation of thick silicides often partially consume or destroy semiconductor materials and may thus destroy the active area 202. Furthermore, silicides can cause surface roughening which may damage the active area 202. In the event that a silicide is formed the selection of one of $NiSi_2$, $CoSi_2$, TiN, WTiN or WTi may ensure that silicide formation is limited to very thin silicides of approximately 3 nm, which is substantially thinner than the active area 202 thickness of 20-25 nm.

The second metal layer 220, also known as the intermediate metal layer, is arranged to contact the first metal layer 218. The second metal layer 220 is arranged to be plastically deformable. Specifically, the second metal layer 220 will be deformed during the contacting process as mentioned above thus ensuring at the stress on the underlying first metal layer 218 and the active area 202 is not increased. In addition, the second metal layer 220 counteracts the different mechanical behaviours, such as coefficient of expansion, of the first metal layer 218 and the third metal layer 222.

Furthermore, the second metal layer 220 may also be arranged to protect the first metal layer 218 from mechanical damage which may be caused when forming a device connection, such a clip bonded connection or wire bonded connection to the third metal layer 222. Examples of materials for forming second metal layer 220 are Ag, Al or Al based alloys such as AlSi, AlCu or AlCuSi. As mentioned above the active area 202 may be subject to local strain due to the strained growth in combination with epitaxial layer 204, or substrate beneath.

In addition, further local stress can arise as a result of, for example, wire bonds or local asymmetries in clip bonds attached to the electrical contact 206. This stress on the active area 202 will be plastically relaxed in the first metal layer through the use of the second metal layer 220, and in this regard the thickness of the second metal layer may be above 300 nm where a clip bond is attached to the electrical contact 206 or above 1000 nm where a wire bond is attached to the electrical contact 206.

The third metal layer 222, also known as the top metal layer is arranged to contact the second metal layer 220. In addition, the third metal layer 222 is arranged to form an Ohmic connection to the underlying second metal layer 220 and third metal layer 222 structure. Furthermore, the third metal layer 222 provides good thermal contact to either the wire bond, or the clip bond, forming the external contact and the second metal layer 220. This ensures that that heat generated during operation is dissipated. Examples of materials for forming the third metal layer 222 are dependent on the package technology used and are set out below.

For wire bond packaging technology, the third metal layer 222 may be formed of Al, Cu, Ag or Au flash to prevent oxidation corrosion of underlying metal layers and allow for the mechanical connection of the wire bond connection thereto. In the case of wire bonding the third metal layer 222 may be a separate metal layer. However, in the case where the second metal layer is formed of Ag or Al, the third metal layer may be combined with the second metal layer and formed as a single layer provided that the thickness of the combined second and third metal layer 220, 222 has a thickness of at least 1.5 μm, due to the consumption of Ag or Al during wire bonding processes.

For clip bonded packages, the third metal layer 222 must be capable of receiving a solder material for connection of a clip or wire bond during packaging. In addition, the third metal layer 222 should be mechanically stable and be resistant to thermomechanical damage during the clip bonding process. The third metal layer will also provide protection against surface damage during the clip bonding process.

For clip bonded packaging technology, the third metal layer 222 may be formed of for example Ni. Alternatively, the third metal layer 222 may be formed of for example a stack of Ni with a thin layer, for example 200 nm of Ag, to prevent oxidation of the Ni layer. Furthermore, the third metal layer 222 may comprise a stack of an initial layer of Ti placed between the Ni layer of the third metal layer 222 and the second metal layer 218 to improve adhesion to the third metal layer 222. The use of Ti improves adhesion of the second layer metal to the third layer because Ti provides good adhesion on metal and slightly oxidized surfaces, whilst also providing low contact resistance.

Alternatively, the third metal layer 222 may comprise Cu or Ag. In the case of Cu, a Sn layer may be applied to the third metal layer to improve solderability of the third metal layer to a clip connection. Alternatively, the third metal layer can be formed of layers of Ti and Ni, layers of Ti and NiV, layers of Ti, NiV and Ag, layers of Ti, Ni and Ag. Where the third metal layer is formed of an alloy of NiV it may comprise 20% V to make the alloy non-magnetic. This allows for improved sputter deposition.

For bump bonded contacts, which are common in flip chip processing solder bumps will be provided on the third metal layer 222, as a bump bonded connection to a carrier such as a printed circuit board. In this regard, the third metal layer should be mechanically stable and also provide good solderability, that is form a good solder contact to the contact of the chosen carrier. Different metals may be used for the third metal layer 222, such as Ni, Ag or a stack of Ni with Ag, where the purpose of Ag is to improve surface wetting for soldering and also to reduce oxidation.

Alternatively, the third metal layer may be formed of a stack of Ni and Pd and Au, or a stack of Cu and Sn. In addition, a Ti adhesion layer may be used to improve adhesion to the underlying second metal layer 220.

Each of the first, second and third metal layers 218, 220 and 222 as mentioned above may be deposited by known galvanic deposition, sputtering or electroplating processes.

Whilst the above discussion relates to an anode electrical contact 106 formed on an active area 102, 202, the skilled person will appreciate that the electrical contact 106, in accordance with the above described embodiments may also be applied to a semiconductor device as a cathode electrical contact. In this regard the anode and the cathode of a diode may be formed in accordance with the above described embodiments. Likewise, a collector, base and/or emitter, or source, gate and/or drain connection may be formed in accordance with the above described embodiments.

Figure 3:
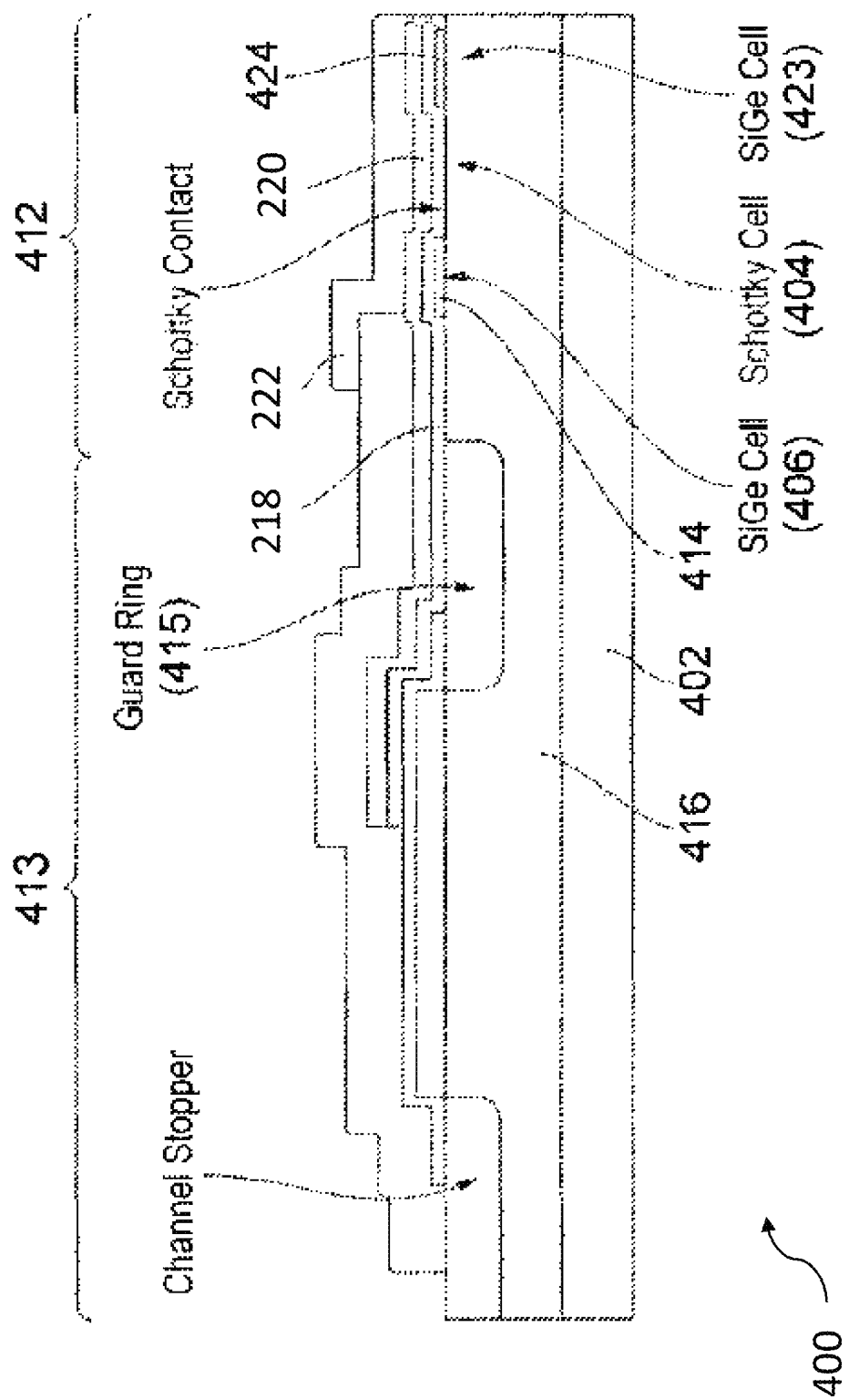
FIG. 3 illustrates a typical semiconductor device comprising the electrical contact structure according to an embodiment.

FIG. 3 illustrates an example implementation of a planar hybrid diode 400, which includes an active region 412 located between first termination region 413 and a second termination region (not shown). The termination regions include a Guard Ring structure 415 with a field plate to terminate the active region 412 of the device. A channel stopper may also be included to limit the spread of the channel area and/or to prevent parasitic channels being formed. Termination regions channel stoppers are well known in the art of semiconductor devices and are used to separate active regions of different devices on the same substrate and as such the termination regions will not be described in any more detail here.

The portion of the active region 412 that is shown in FIG. 4 includes a first SiGe cell 406, a Schottky cell 404, and a second SiGe cell 423. It will be appreciated that any number of cells can be provided in the active region, in parallel between the metal contacts of the device. In some examples there may be thousands of cells with dimensions of about 2-50 μm. The number and spacing of SiGe and Schottky cells determines the electrical properties of the device, and so it can be considered a design parameter. Spacing between cells of about 10 μm can be used in some examples. Furthermore, as discussed detail below, the cells influence each other, since the SiGe cells can inject holes, which modulate the carrier transport in the Schottky cell 404. Therefore, having the two types of cells intermixed, and not separated, can provide good operation. The hybrid diode 400 of FIG. 4 includes the following layers: a substrate 402, which may be a silicon substrate; an epilayer 416, which may be a silicon epilayer, on top of the substrate 402; a first SiGe layer 414, which forms part of the first SiGe cell 406, on top of the epilayer 416; a second SiGe layer 424, which forms part of the second SiGe cell 423, on top of the epilayer 416. The electrical contact may comprise the arrangement of metal layers as set above in relation to FIG. 2; namely, the first metal layer 218 on top of (i) the first SiGe layer 414, (ii) the second SiGe layer 424, and (iii) the regions of the epilayer 416 that are not covered by the first SiGe layer 414 and the second SiGe layer 424; the Schottky and SiGe cells can be arranged in an array of several repeating cells. The first metal layer 218 can for example be formed from the metal layers or alloys as described above. A second metal layer may be formed on the first metal layer 218, from for example the metal layers or alloys as described above. The third metal layer 222 may be formed on the second metal layer from for example the metal layers or alloys as described above.

The above arrangements of first, second and third metal layers 218, 220 and 222 result in low mechanical stress on each other and thus the underlying semiconductor active area 202. As a result, no dislocations will be formed in the active area 202. In addition, no out diffusion effects will be seen in the active area 202, first SiGe layer 414 or second SiGe layer 424.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. An electrical contact for a discrete semiconductor device, the electrical contact comprising:
    a first metal layer of the electrical contact configured and arranged directly on a strained active area of a semiconductor die to form a Schottky barrier, the strained active area comprising a silicon germanium (SiGe) material;
    a second metal interface layer of the electrical contact formed of a plastically deformable metal and arranged on the first metal layer to contact the first metal layer, wherein the second interface metal layer is formed of Al or Ag; and
    a third metal layer configured and arranged to contact the second interface metal layer to form an external electrical contact layer of the electrical contact.

2. The electrical contact according to claim 1, wherein the strained active area of the semiconductor die is an anode region.

3. The electrical contact according to claim 2, wherein the anode region is formed of a silicon germanium (SiGe) material.

4. The electrical contact according to claim 3, wherein the first metal layer is configured to be arranged directly on the strained active area to form a Schottky barrier.

5. The electrical contact according to claim 1, wherein the first metal layer is formed of one material selected from the group consisting of NiSi2, COSi2, TiN, WTiN and Wfi.

6. The electrical contact according to claim 1, wherein the second interface metal layer is formed of an alloy of the Al comprising an element selected from the group consisting of Si and Cu, and combinations thereof.

7. The electrical contact according to claim 1, wherein the third metal layer is an Ohmic contact layer and is arranged to contactably receive a clip bond, wire bond or bump bond.

8. The electrical contact according to claim 7, wherein when the third metal layer is arranged for clip bonding, the third metal layer is formed of one element selected from the group consisting of: Ni, Cu, and Ag.

9. The electrical contact according to claim 7, wherein when the third metal layer is arranged for clip bonding, the third metal layer is formed of one stack selected from the group consisting of:
    a stack of Ni and Ag,
    a stack of Ti and Ni,
    a stack of Cu and Sn,
    a stack of Ti and NiV,
    a stack of Ti, Ni and Ag, and
    a stack of Ti, NiV and Ag.

10. The electrical contact according to claim 7, wherein when the third metal layer is arranged for wire bonding, the third metal layer is formed of one material selected from the group consisting of Al, AlSi, AlCu, AlSiCu, Cu, and Ag.

11. The electrical contact according to claim 7, wherein when the third metal layer is arranged for bump bonding, the third metal layer is formed of one element selected from the group consisting of Ni and Ag.

12. The electrical contact according to claim 7, wherein when the third metal layer is arranged for bump bonding, the third metal layer is formed of one stack selected from the group consisting of a stack of Ni and Ag, a stack of Ni and Pd and Au, and a stack of Cu and Sn.

13. The electrical contact according to claim 11, wherein the third metal layer includes an initial layer of Ti.

14. A semiconductor device comprising the electrical contact according to claim 1.

15. A method of manufacturing an electrical contact for a discrete semiconductor device, the method comprising:
- forming a first metal layer as a base layer configured and arranged directly on a strained active area of a semiconductor die to form a Schottky barrier, the strained active area comprising a silicon germanium (SiGe) material;
- forming a second metal interface layer as an intermediate layer comprising a plastically deformable metal on the first metal layer to contact the first metal layer on an opposite side of the first metal layer arranged to contact the strained active area of the semiconductor die, wherein the second interface metal layer is formed of Al or Ag; and
- forming a third metal layer as a top layer to contact the second metal interface layer, the top layer being configured for external electrical contact.

* * * * *